United States Patent
Takei et al.

(10) Patent No.: US 9,299,940 B2
(45) Date of Patent: Mar. 29, 2016

(54) CARBON NANOTUBE NETWORK THIN-FILM TRANSISTORS ON FLEXIBLE/STRETCHABLE SUBSTRATES

(71) Applicants: Kuniharu Takei, Berkeley, CA (US); Toshitake Takahashi, Oakland, CA (US); Ali Javey, Emeryville, CA (US)

(72) Inventors: Kuniharu Takei, Berkeley, CA (US); Toshitake Takahashi, Oakland, CA (US); Ali Javey, Emeryville, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/065,218

(22) Filed: Oct. 28, 2013

(65) Prior Publication Data

US 2014/0124737 A1   May 8, 2014

Related U.S. Application Data

(60) Provisional application No. 61/721,637, filed on Nov. 2, 2012.

(51) Int. Cl.
  *H01L 51/05* (2006.01)
  *B82Y 30/00* (2011.01)
  *H01L 51/00* (2006.01)

(52) U.S. Cl.
  CPC .............. *H01L 51/0558* (2013.01); *B82Y 30/00* (2013.01); *H01L 51/0048* (2013.01); *H01L 51/0097* (2013.01); *H01L 51/0545* (2013.01)

(58) Field of Classification Search
  CPC ........................... H01L 51/0048; H01L 29/775
  USPC ............................................ 257/29; 977/742
  See application file for complete search history.

(56) References Cited

U.S. PATENT DOCUMENTS

| | | | | |
|---|---|---|---|---|
| 5,367,180 | A  * | 11/1994 | Asai et al. | 257/66 |
| 8,604,459 | B1 * | 12/2013 | Ward et al. | 257/9 |
| 2003/0124769 | A1 * | 7/2003 | Dotta et al. | 438/108 |
| 2004/0233724 | A1 * | 11/2004 | Shibata et al. | 365/185.18 |
| 2005/0212014 | A1 * | 9/2005 | Horibe et al. | 257/213 |
| 2005/0266605 | A1 * | 12/2005 | Kawakami | 438/99 |
| 2006/0261419 | A1 * | 11/2006 | Kreupl et al. | 257/401 |
| 2008/0265293 | A1 * | 10/2008 | Lee et al. | 257/288 |
| 2011/0215315 | A1 * | 9/2011 | Toguchi et al. | 257/40 |
| 2014/0070169 | A1 * | 3/2014 | Zhou et al. | 257/29 |

OTHER PUBLICATIONS

Wang et al., Nano Lett., 2012, 12 (3), 1527-1533.
Takahashi et al., Nano Lett., 2011, 11 (12), 5408-5413.
Sekitani, T.; Someya, T. Adv. Mater. 2010, 22, 2228-2246.
Kim, D. H.; Xiao, J.; Song, J.; Huang, Y.; Rogers, J. A. Adv. Mater. 2010, 22, 2108-2124.
Wagner, S.; Lacour, S. P.; Jones, J.; Hsu, P. H. I.; Sturm, J. C.; Li,T.; Suo, Z. Physica E 2004, 25, 326-334.
Engel, M.; Small, J. P.; Steiner, M.; Freitag, M.; Green, A. A.; Hersam, M. C.; Avouris, P. ACS Nano 2008, 2, 2445-2452.

(Continued)

*Primary Examiner* — Tucker J Wright
(74) *Attorney, Agent, or Firm* — Lawrence Berkeley National Laboratory

(57) ABSTRACT

This disclosure provides systems, methods, and apparatus for flexible thin-film transistors. In one aspect, a device includes a polymer substrate, a gate electrode disposed on the polymer substrate, a dielectric layer disposed on the gate electrode and on exposed portions of the polymer substrate, a carbon nanotube network disposed on the dielectric layer, and a source electrode and a drain electrode disposed on the carbon nanotube network.

20 Claims, 5 Drawing Sheets

(56) References Cited

OTHER PUBLICATIONS

Wang, C.; Zhang, J.; Ryu, K.; Badmaev, A.; Arco, L. G. D.; Zhou, C. Nano Lett. 2009, 9, 4285.
Wang, C.; Zhang, J.; Zhou, C. ACS Nano 2010, 4, 7123-7132.
Rouhi, N.; Jain, D.; Zand, K.; Burke, P. J. Adv. Mater. 2011, 23, 94-99.
Cao, Q.; Kim, H. S.; Pimparkar, N.; Kulkarni, J. P.; Wang, C.; Shim, M.; Roy, K.; Alam, M. A.; Rogers, J. A. Nature 2008, 454, 495-500.
Sun, D.; Timmermans, M. Y.; Tian, Y.; Nasibulin, A. G.; Kauppinen, E. I.; Kishimoto, S.; Mizutani, T.; Ohno, Y. Nat. Nanotechnol. 2011, 6, 156-161.
Cao, Q.; Xia, M.; Kocabas, C.; Shim, M.; Rogers, J. A.; Rotkin, S. V. Appl. Phys. Lett. 2007, 90, 023516-1-023516-3.

* cited by examiner

US 9,299,940 B2

CARBON NANOTUBE NETWORK THIN-FILM TRANSISTORS ON FLEXIBLE/STRETCHABLE SUBSTRATES

RELATED APPLICATIONS

This application claims priority to U.S. Provisional Patent Application No. 61/721,637, filed Nov. 2, 2012, which is herein incorporated by reference.

STATEMENT OF GOVERNMENT SUPPORT

This invention was made with government support under Contract No. DE-AC02-05CH11231 awarded by the U.S. Department of Energy and under Grant No. EEC-0832819 awarded by the U.S. National Science Foundation, and under Contract No. W911NF-11-1-0089 awarded by DOD Advanced Research Projects Agency (DARPA). The government has certain rights in this invention.

TECHNICAL FIELD

This disclosure relates generally to flexible and stretchable electronics and more particularly to flexible and stretchable carbon nanotube thin-film transistors.

BACKGROUND

In recent years, flexible and stretchable electronics have been intensively explored for enabling new applications otherwise unachievable with conventional silicon technology. A wide range of active channel materials have been explored, including: organics; amorphous, poly-, and single-crystalline semiconductors in the shape of thin films and strips; printed semiconducting nanowires (NWs); and single-walled carbon nanotubes (SWNTs). Each of these material systems presents unique opportunities and challenges for large-area electronics. For instance, randomly deposited films of SWNTs are attractive candidates given their high carrier mobility, high chemical stability, ability to deposit through solution processing, and superb mechanical properties such as high bendability.

SUMMARY

One innovative aspect of the subject matter described in this disclosure can be implemented in an device including a polymer substrate, a gate electrode disposed on the polymer substrate, a dielectric layer disposed on the gate electrode and on exposed portions of the polymer substrate, a carbon nanotube network disposed on the dielectric layer, and a source electrode and a drain electrode disposed on the carbon nanotube network.

In some embodiments, the device further includes a polymer layer disposed on the source electrode, the drain electrode, and exposed portions of the carbon nanotube network. In some embodiments, the polymer layer defines vias to the gate electrode, the source electrode, and the drain electrode. In some embodiments, the device further includes three metal traces on the polymer layer, a single metal trace contacting each of the gate electrode, the source electrode, and the drain electrode.

In some embodiments, the dielectric layer includes an alumina layer, a first silicon oxide layer disposed on a first side of the alumina layer, and a second silicon oxide layer disposed on a second side of the alumni layer. In some embodiments, an area defined by the device is about 2.5 microns to 7.5 microns by about 100 microns to 300 microns. In some embodiments, the gate electrode includes nickel, and the source electrode and the drain electrode include palladium.

In some embodiments, the carbon nanotube network is about 2 nanometers to 20 nanometers thick. In some embodiments, the carbon nanotube network has a density of about 10 to 100 nanotubes per micron area of the carbon nanotube network.

In some embodiments, the device is mechanically flexible. In some embodiments, the dielectric layer is about 20 nanometers to 70 nanometers thick. In some embodiments, nanotubes of the carbon nanotube network have a length of about 0.3 microns to 5 microns or about 0.4 microns to 0.12 microns. In some embodiments, nanotubes of the carbon nanotube network have a length of about 0.8 microns.

In some embodiments, the polymer substrate defines a mesh structure. In some embodiments, the mesh structure includes a honeycomb mesh structure defining substantially hexagonal holes in the polymer substrate. In some embodiments, the device is located at an intersection of three lines of the honeycomb mesh structure.

Another innovative aspect of the subject matter described in this disclosure can be implemented in a method including depositing a gate electrode on a polymer substrate, depositing a dielectric layer on the gate electrode and on exposed portions of the polymer substrate, depositing a carbon nanotube network on the dielectric layer, and depositing a source electrode and a drain electrode on the carbon nanotube network.

In some embodiments, the method further includes depositing a polymer layer on the source electrode, the drain electrode, and exposed portions of the carbon nanotube network. In some embodiments, the method further includes vacuum annealing the carbon nanotube network after depositing the carbon nanotube network.

In some embodiments, the method further includes depositing the polymer substrate on a handling substrate, and after depositing the source electrode and the drain electrode, removing the polymer substrate from the handling substrate. In some embodiments, the handling substrate includes a release dielectric layer, and the polymer substrate is deposited on the release dielectric layer of the handling substrate. In some embodiments, the method further includes forming a mesh pattern in the polymer substrate.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

4B and 4C show examples of optical images of the relaxed and the stretched state, respectively, of the polyimide substrate with a=1.25 mm.

DETAILED DESCRIPTION

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

Introduction

A challenge has been to fabricate devices with a high ON/OFF current ratio, given that nanotube networks often consist of a mixture of semiconductor and metallic SWNTs. In this regard, highly semiconductor-enriched (99%) SWNTs have been recently reported and commercialized through the use of a density gradient ultracentrifugation technique. This development has allowed for the fabrication of high performance SWNT thin-film transistors (TFTs) that exhibit high $I_{ON}/I_{OFF}$ (>$10^2$) and mobility (>10 cm$^2$/(V s)) on rigid Si substrates. This presents an important advance in the field and could result in the development of highly scalable and low-cost electronics with performances drastically superior to those of conventional organics or a-Si. Embodiments disclosed herein include mechanically flexible and stretchable active-matrix backplanes and integrated circuits based on semiconductor-enriched SWNT networks. Embodiments include fully passivated and highly uniform SWNT TFT arrays, covering large areas of about 7.5 centimeters (cm)×7.5 cm. In some embodiments, this active-matrix backplane may be used for an artificial electronic skin (e-skin) device, capable of spatial mapping of touch, for example.

Apparatus

Figure 1:
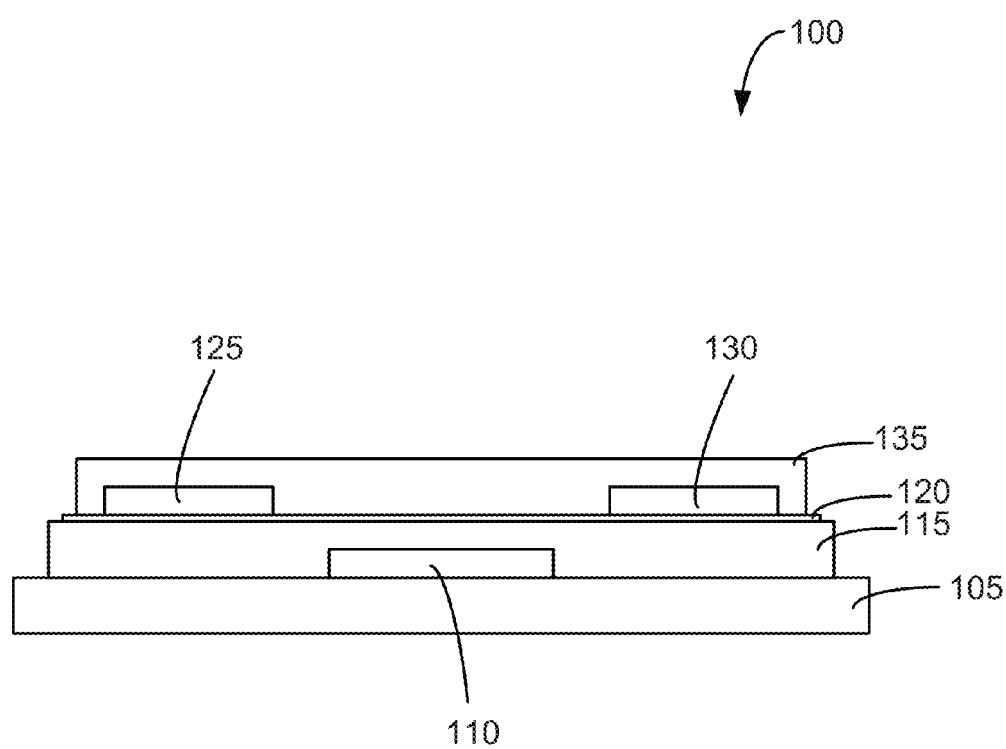
FIG. 1 shows an example of a cross-sectional schematic illustration of a TFT device.

FIG. 1 shows an example of a cross-sectional schematic illustration of a thin-film transistor (TFT) device. The TFT device 100 may include a polymer substrate 105, a gate electrode 110, a dielectric layer 115, a carbon nanotube network 120, a source electrode 125 and a drain electrode 130, and a polymer layer 135.

In some embodiments, the polymer substrate 105 may include a polyimide or other polymer. In some embodiments, the polymer substrate 105 may be about 10 microns to 40 microns thick, or about 24 microns thick. In some embodiments, the polymer substrate 105 may include a mesh structure. For example, the mesh structure may include a honeycomb mesh structure defining substantially hexagonal holes in the polymer substrate. Each of the hexagonal holes may have a side length (i.e., a length of a side of a hexagon in the hexagonal mesh structure) of about 0.5 millimeters (mm) to 2 mm, such as about 1 mm, about 1.25 mm, about 1.5 mm, and about 1.85 mm. In some embodiments, the TFT device (see FIG. 3A) may be located at an intersection of three sides in the honeycomb mesh structure.

The gate electrode 110 is disposed on the polymer substrate 105. In some embodiments, the gate electrode 110 may be about 10 nanometers (nm) to 100 nm thick, or about 35 nm thick. In some embodiments, the gate electrode 110 may include nickel. In some embodiments, the gate electrode 110 may include layers of different metals. For example, in some embodiments, the gate electrode 110 may include a layer of titanium (e.g., about 5 nm thick) with a layer of gold (e.g., about 30 nm thick) disposed on the layer of titanium, with the layer of titanium being disposed on the polymer substrate 105.

The dielectric layer 115 is disposed on the gate electrode 110 and exposed portions of the polymer substrate 105. In some embodiments, the dielectric layer 115 may be about 20 nm to 70 nm thick, or about 45 nm thick. In some embodiments, the dielectric layer 115 may include layers of different dielectric materials. For example, the dielectric layer 115 may include an alumina layer, a first silicon oxide layer disposed on a first side of the alumina layer, and a second silicon oxide layer disposed on a second side of the alumni layer; i.e., a tri-layer dielectric layer. The first silicon oxide layer, which is disposed on the gate electrode and exposed portions of the polymer substrate, may aid in the nucleation of the alumina layer. The second silicon oxide layer may aid in the adhesion of the carbon nanotube network. In some embodiments, the alumina layer may be about 20 nm thick, the first silicon oxide layer may be about 10 nm thick, and the second silicon oxide layer may be about 15 nm thick.

In some embodiments, the dielectric layer 115 may include an alumina layer and a silicon oxide layer, with the alumina layer being disposed on the gate electrode and exposed portions of the polymer substrate; i.e., a bilayer dielectric layer. In some embodiments, the alumina layer may be about 20 nm thick and the silicon oxide layer may be about 15 nm thick.

The carbon nanotube network 120 is disposed on the dielectric layer 115. In some embodiments, the carbon nanotube network 120 includes a plurality of carbon nanotubes, such a single-walled carbon nanotubes. In some embodiments, the carbon nanotube network 120 may be about 2 nm to 20 nm thick, or about 10 nm thick. In some embodiments, the carbon nanotube network 120 may have a density of about 10 to 100 nanotubes per micron area of the carbon nanotube network 120. In some embodiments, nanotubes in the carbon nanotube network 120 may have a length of about 0.3 microns to 5 microns, about 0.4 microns to 0.12 microns, or about 0.8 microns.

The source electrode 125 and the drain electrode 130 are disposed on the carbon nanotube network 120. In some embodiments, the source electrode 125 and the drain electrode 130 may each be about 20 nm to 50 nm thick, or about 35 nm thick. In some embodiments, the source electrode 125 and the drain electrode 130 each include palladium. In some embodiments, the source electrode 125 and the drain electrode 130 may include layers of different metals. For example, the electrodes may include a layer of titanium (e.g., about 5 nm thick) and a layer of palladium (e.g., about 35 nm thick) disposed on the layer of titanium, with the layer of titanium being disposed on the carbon nanotube network.

In some embodiments, the TFT device may be mechanically flexible. That is, the TFT device may be able to be bent (e.g., the polymer substrate and the layers disposed on the polymer substrate may not be in a two dimensional plane or may not be flat), and the TFT device may still maintain its functionality. In some embodiments, a TFT device may have a channel length of L about 3 microns and a channel width of W about 200 microns or about 250 microns, as defined by the source electrode and the drain electrode. In some embodiments, an area defined by the TFT device (in a top-down view of the TFT device (not shown), as opposed to the cross-sectional schematic illustration shown in FIG. 1) may be about 2.5 microns to 7.5 microns by about 100 microns to 300 microns, or about 5 microns by 200 microns.

In some embodiments, the TFT device may further include a polymer layer 135 disposed on the source electrode 125 and the drain electrode 130 and exposed portions of the carbon nanotube network. In some embodiments, the polymer layer 135 may include a poly(p-xylylene) polymer. In some embodiments, the polymer layer 135 may be about 250 nm to 1 micron thick. In some embodiments, the polymer layer 135 may encapsulate active components of the TFT device and protect these components from the environment. In some embodiments, the polymer layer 135 may suppress a strain effect of active components when the polymer substrate bends. In some embodiments, the polymer layer 135 may define vias to the gate electrode 110, the source electrode 125, and the drain electrode 130. The surface of the polymer layer may have three metal traces (not shown) disposed on it, a single metal trace contacting each of the gate electrode 110, the source electrode 125, and the drain electrode 130.

Method

Figure 2:
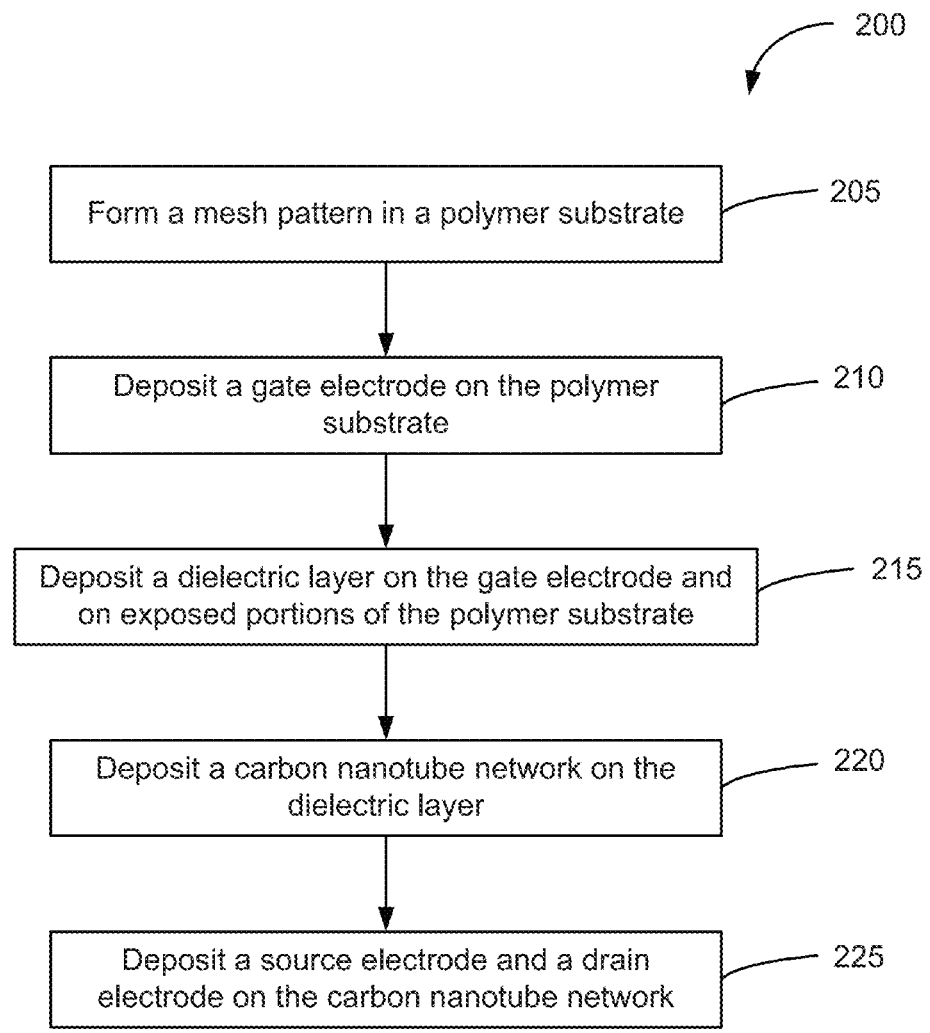
FIG. 2 shows an example of a method of manufacturing a TFT device.

FIG. 2 shows an example of a method of manufacturing a TFT device. The process 200 shown in FIG. 2 may include patterning techniques, including masking as well as etching processes, to define the shapes of the different components of the TFT device, as known by one of ordinary skill in the art. The process 200 begins with operation 205, in which a mesh pattern is formed in a polymer substrate. In some embodiments, the mesh pattern may be laser cut into the polymer substrate. Operation 205 is performed when forming a flexible TFT device that also is able to be stretched. In some embodiments, when forming a flexible TFT device that is not able to be substantially stretched, operation 205 may not be performed.

In operation 210, a gate electrode is deposited on the polymer substrate. In some embodiments, the gate electrode may be deposited with a chemical vapor deposition (CVD) process, an atomic layer deposition (ALD) process, or physical vapor deposition process (PVD). Examples of PVD processes include thermal evaporation and electron beam (e-beam) evaporation.

In operation 215, a dielectric layer is deposited on the gate electrode and on exposed portions of the polymer substrate. In some embodiments, the dielectric layer may be deposited with a CVD process, an ALD process, or a PVD process. In some embodiments, the dielectric layer may include different layers of dielectric material.

In operation 220, a carbon nanotube network is deposited on the dielectric layer. In some embodiments, the carbon nanotube network may be deposited with a solution casting process. In some embodiments, a solution casting process may be performed for about 5 minutes to 120 minutes (e.g., about 5 minutes, about 15 minutes, about 30 minutes, about 90 minutes, or about 120 minutes) to deposit a desired density of carbon nanotubes. In some embodiments, after depositing the carbon nanotube network, the carbon nanotube network may be rinsed with a solvent, such as de-ionized (DI) water, for example. In some embodiments, after depositing the carbon nanotube network, the carbon nanotube network may be vacuum annealed. The vacuum annealing may be performed at about 100° C. to 300° C., or about 200° C., for about 30 minutes to 1.5 hours, or about 1 hour. Vacuum annealing the carbon nanotube network may remove surfactant residues from the nanotubes of the carbon nanotube network as well as improve both the transconductance and the $I_{ON}/I_{OFF}$ of the TFT device.

In operation 225, a source electrode and a drain electrode are deposited on the carbon nanotube network. In some embodiments, the source electrode and the drain electrode may be deposited with a CVD process, an ALD process, or a PVD process.

In some embodiments, the process 200 may further include an operation of depositing a polymer layer on the source electrode, the drain electrode, and exposed portions of the carbon nanotube network. In some embodiments, vias may be formed in the polymer layer to allow contact to the electrodes of the TFT device. For example, the vias may be formed using an etching process, such as an oxygen plasma etching process.

In some embodiments, the dielectric layer may be treated to improve the adhesion of the carbon nanotube network to the dielectric layer. For example, in some embodiments, the treatment may be used to functionalize a surface of the dielectric layer; i.e., the treatment may introduce chemical functional groups to dielectric surface. In some embodiments, a silicon oxide surface may be functionalized by exposing the silicon oxide surface to a poly-L-lysine solution (e.g., for about 5 minutes), which may form an amine-terminated adhesion layer, followed by a rinse with deionized water.

In some embodiments, the polymer substrate may be deposited on a handling substrate. In some embodiments, the polymer substrate may be deposited on a handling substrate, prior to forming a mesh pattern in a polymer substrate. For example, the handling substrate may include a silicon wafer. The polymer substrate may be deposited on the handling substrate using a spin-coating process. The handling substrate may support the polymer substrate during the TFT device fabrication process. Then, after fabricating the TFT device (e.g., after depositing the source electrode and the drain electrode or after depositing the polymer layer), the polymer substrate may be removed from the handling substrate.

In some embodiments, the handling substrate may include a dielectric release layer on the handling substrate, with the polymer substrate being deposited on the release dielectric layer of the handling substrate. For example, the dielectric release layer may include silicon dioxide. Removing the polymer substrate from the handling substrate may easily be performed due to poor adhesion between the polymer substrate and the release dielectric layer.

The embodiments disclosed herein are broadly applicable to flexible and/or stretchable electronics. The embodiments may be easily scalable and adaptable for large scale manufacturing (e.g., display manufacturing, RFID manufacturing, and wearable electronics manufacturing) and new applications (e.g., electronic walls and electronic skin).

EXPERIMENTAL

The following examples are intended to be examples of the embodiments disclosed herein, and are not intended to be limiting. The following examples describe the development of carbon nanotube network thin-film transistors on flexible/stretchable substrates.

Figure 3A:
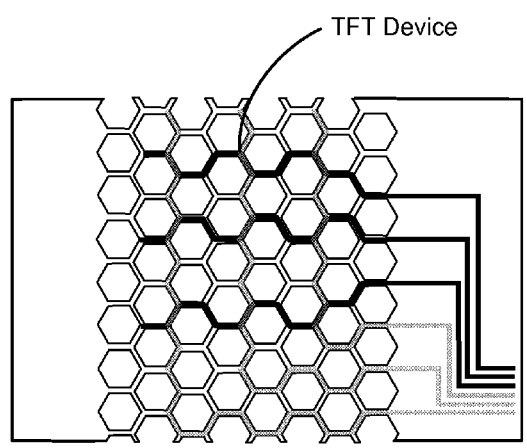
FIG. 3A shows an example of a schematic of a mechanically flexible/stretchable active-matrix back-plane (6×4 $cm^2$ with 12×8 pixel array) based on SWNT-TFTs.
Figure 3B:
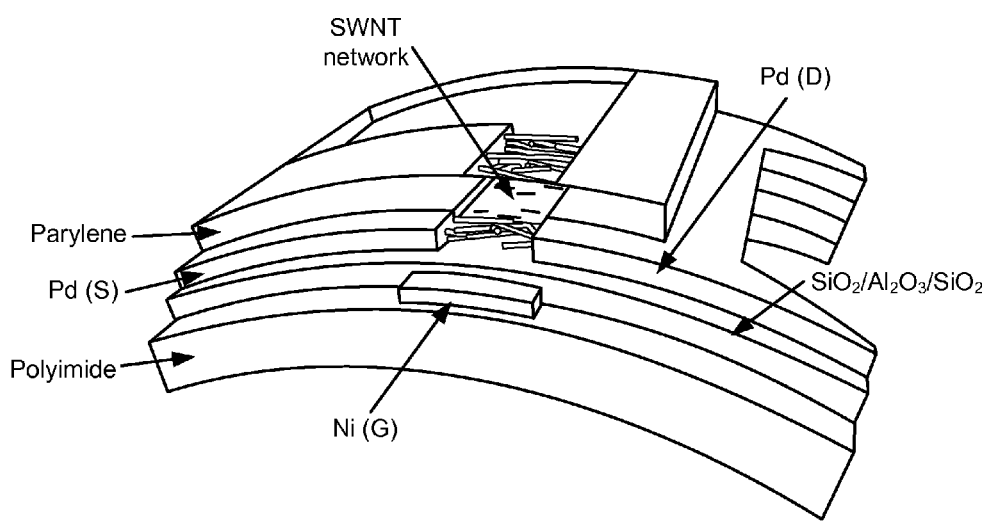
FIG. 3B shows an example of an expanded schematic of a single TFT.

The device schematic of a mechanically deformable active-matrix backplane based on SWNT-TFTs is shown in FIGS. 3A and 3B. A 24-μm-thick polyimide (PI) layer is used as the substrate. First, the PI was spin-coated twice (2000 rpm for 1 min) on a Si/SiO$_2$ handling 4"-wafer, followed by Ni gate electrode deposition by thermal evaporation. The gate oxide consisted of three layers, with a 20-nm-thick Al$_2$O$_3$ layer deposited by atomic layer deposition (ALD) sandwiched between electron-beam deposited SiO$_x$ layers (thicknesses, 10 nm and 15 nm on bottom and top, respectively). The bottom SiO$_x$ layer was used to enable nucleation of ALD Al$_2$O$_3$ on the substrate, while the top SiO$_x$ layer is used for adhesion of SWNTs. Note that it was observed that SWNTs are highly non-sticky to ALD Al$_2$O$_3$ surfaces, presumably due to fixed charges in the as-deposited alumina layer. To deposit highly dense and uniform SWNTs networks, the SiO$_x$ surface was modified with poly-L-lysine by solution casting for ~5 min followed by a rinse with DI water. In this study, as-received 99% semiconductor enriched SWNT solution was used, without any densification. SWNTs were then deposited by solution casting followed by rinse in DI water.

Atomic force microscopy (AFM) images of the SWNT coated substrates for three different nanotube deposition times were recorded. As evident from the images, the density of SWNTs on the evaporated SiO$_x$ depended on the deposition time, and was estimated to be ~6, 8, and 10 SWNTs/µm for the deposition time of 5, 30, and 90 minutes, respectively. It should be noted that the density of SWNTs as a function of deposition time was highly dependent on the particular surface being explored. For instance, higher densities of SWNTs with higher bundling probability are observed for similar deposition times on thermally grown SiO$_2$ layers. Furthermore, the density depended on the nanotube solution, in part because different semiconductor-enriched products utilize different surfactants.

Next, vacuum annealing at 200° C. for 1 hr was performed to remove surfactant residues. This annealing process was needed to improve both the transconductance and $I_{ON}/I_{OFF}$ of the devices. Pd (thickness, ~35 nm) source/drain (S/D) electrodes were then patterned using photolithography, metallization, and lift-off to enable ohmic contacts to the valence band of nanotubes for hole transport. Finally, the fabrication process was completed by encapsulating the active matrix with a poly(p-xylylene) polymer (~500 nm; e.g., parylene-C) to improve the mechanical robustness and chemical stability by removing environmental effects, including surface absorbed water molecules. Via contacts were made by pattern etching of the poly(p-xylylene) polymer using photolithography and O$_2$ plasma etch. After the completion of the entire process, the PI layer was readily peeled off from the handling wafer, resulting in a mechanically flexible device. Here, after cutting the edge of the substrate with a razor blade, the PI layer was readily released due to the poor adhesion between PI and SiO$_2$. During this process no breakage of the metal lines or active regions is observed due to the poly(p-xylylene) polymer encapsulation.

The variations of the key performance metrics of the SWNT TFTs were slightly larger than the state-of-the art organic materials despite the fact that the devices were processed in non-cleanroom environment, but are sufficient for applications such as active-matrix backplanes. Of particular importance, a high mobility, such as those obtained here, is highly desired for lowering the operating voltage and the size (i.e., width) of the FETs. This presents a major advantage for the use of SWNT TFTs over their organic counterparts for use as the active matrix backplanes, despite the fact that both are solution-processed. In addition, given the graphitic nature of SWNTs, they are highly robust and chemically stable, without degradation over time. These properties clearly set the advantage of semiconductor-enriched SWNT networks for large-area electronics. Here, the use of SWNT-TFTs for mechanically flexible and stretchable backplanes using PI as the support substrate was studied. These backplanes could serve for development of displays, sensor arrays and imagers, just to name a few examples.

Figure 4:
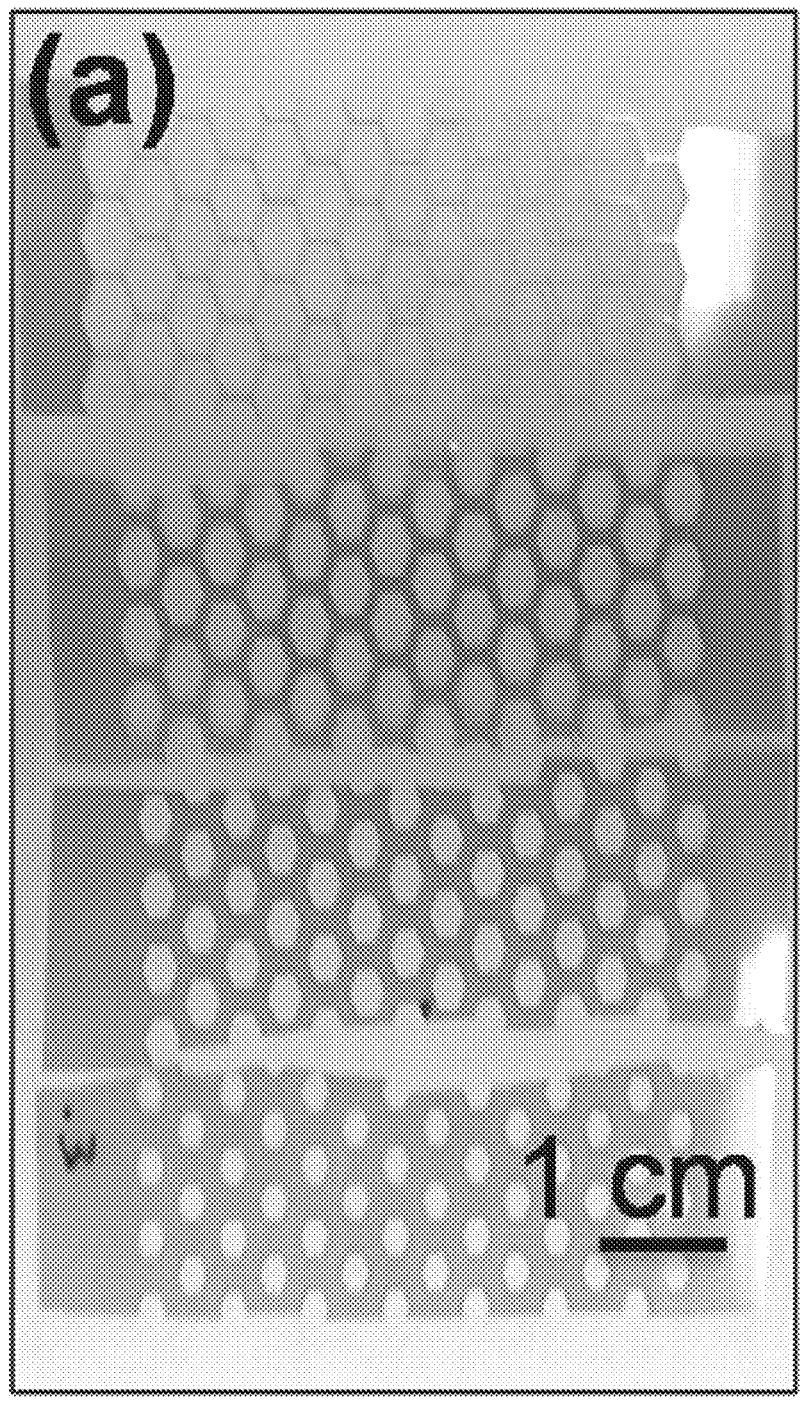
FIG. 4A shows an example of a polyimide mesh substrate with four different side length of hexagonal holes (a=1 mm, 1.25 mm, 1.5 mm, and 1.85 mm, from bottom to top). FIGS.
Figure 4:
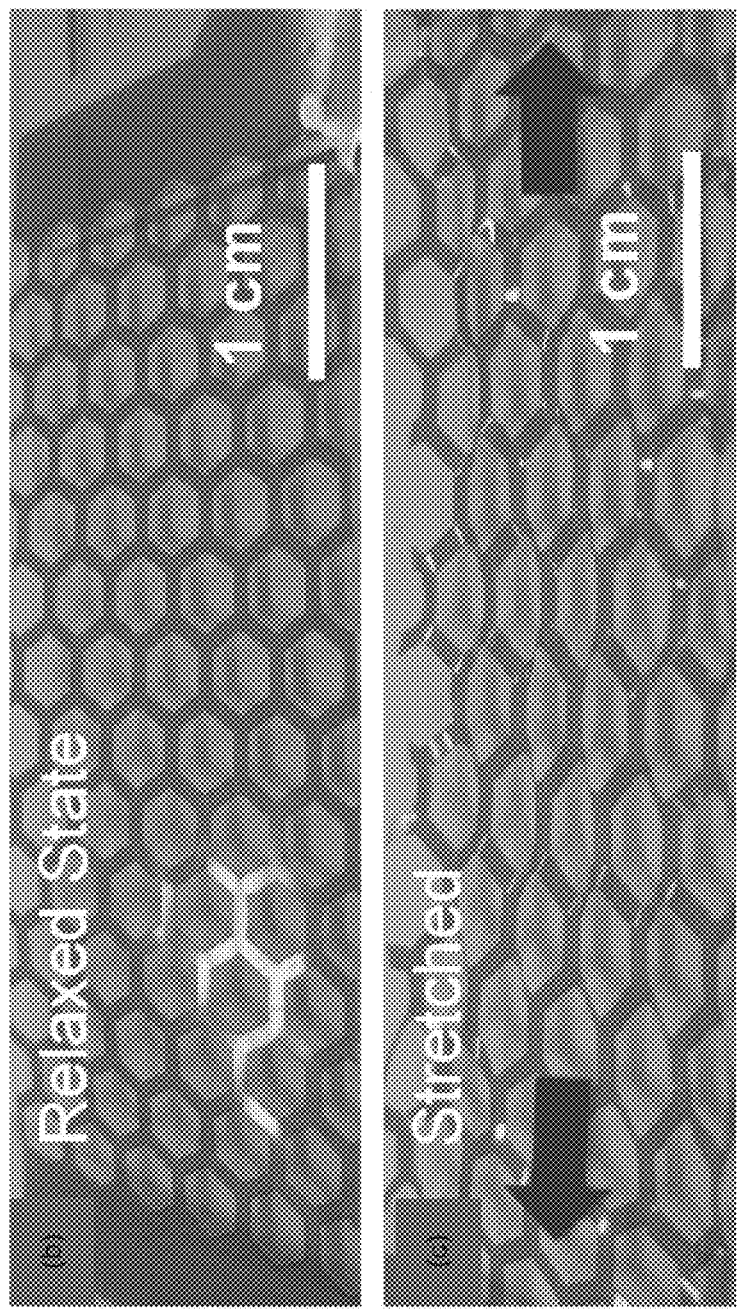

To obtain mechanically stretchable electronics, several approaches have been previously reported such as micro/nanostructures in 'wavy' layouts and open mesh substrate geometries. Here, to reduce process complexity and make the substrate more robust against unidirectional stretching, a honeycomb mesh structure, where an array of holes in the shape of hexagons are laser cut on a thin PI substrate with a fixed pitch of 3.3 mm and a varied hole side-length of a =1-1.85 mm (see FIG. 4A), was used. The mechanical stretchability of the PI mesh was then characterized as a function of a. The stretchability is defined as the maximum engineering strain that the substrates can tolerate before failure (i.e., breakage). The stretchability increased from zero to ~60% as the side length of the hexagonal holes increases from 0 to 1.85 mm. This observation is consistent with the mechanical simulations, where the induced stress is found to be reduced by increasing the hole size. The unpatterned PI film was stiff and incapable of stretching. By cutting a honeycomb mesh pattern on the substrate, the enabled structure became stretchable because the PI bridges in-between the hexagonal holes can twist as evident from the optical images in FIGS. 4B and 4C. Due to a structural symmetry, the honeycomb mesh is invariant to every 60° rotation, so the same stretchability can be observed for those directions. The degree of stretchability and directionality can be further tuned in the future by either changing the hole size and/or optimizing the mesh design.

The mechanical stability of SWNT-TFT arrays on a honeycomb-structured PI substrate was studied. The PI substrate was laser cut into a honeycomb structure with a =1.25 mm after fully encapsulating the TFTs with parylene. The honeycomb patterned PI substrate with SWNT-TFT arrays can conformably cover a baseball. Here, active devices with L~5 µm and W~200 µm were placed on the bridge intersects of each hexagonal opening in the PI substrate. The nanotube deposition time was 60 minutes, corresponding to ~9 SWNTs/µm. The device functioned with no change for stretching up to ~3 mm displacement, corresponding to ~11.5% stretchability.

To demonstrate the utility of the proposed device scheme, as an example system, SWNT TFT active matrix backplane was used for spatial pressure mapping, consisting of a 12×8 (physical size of 6×4 cm$^2$) pixel array. Here, each pixel was actively controlled by a single TFT. The device effectively functions as an artificial electrical skin (e-skin), capable of detecting and mapping touch profiles. For this purpose, a pressure sensitive rubber (PSR) was laminated on top of the parylene-passivated back-plane. The drain of each transistor was electrically connected to the PSR which is then grounded by an aluminum foil. The source and gate electrodes of the TFTs are used as the bit and word lines, respectively. PSR is near insulating (~30 Mohm) in its relaxed state. However, the resistivity decreases to <0.5 ohm/pixel by applying an external pressure of ~6 kPa due to the shortened tunneling path between the conducting carbon nanoparticles in the PSR. In this e-skin layout, transistor channels and PSR were placed in series, but after a normal pressure of >6 kPa, the resistivity of PSR becomes negligible compared to the TFTs, thereby, resulting in the saturation of the pixel response. To show the functionality of the integrated e-skin, an "L"-shaped weight was placed on top of the sensor array with the normal pressure of ~15 kPa. The enabled pressure mapping demonstrated the utility of SWNT-TFT arrays for active-matrix backplane of sensor arrays on mechanically deformable substrates. In the future, pixel density can be further improved by decreasing the size of both the SWNT active region and the contact region to PSR.

Conclusion

In conclusion, high performance TFT arrays with a hole mobility of 20-50 cm$^2$/Vs and respectable $I_{ON}/I_{OFF} \sim 10^4$ can be uniformly obtained on large-scale plastic substrates by solution processing of semiconductor-enriched SWNT networks. This solution-based approach can be potentially combined with inkjet printing of metal contacts to achieve lithography-free fabrication of low-cost flexible and stretchable electronics with superb electrical and mechanical properties. Notably, to achieve stretchability using robust PI substrates, a concept often used in the paper decoration industry was applied by proper laser cutting of the substrate. The backplane technology explored here can be further expanded in the future by adding various sensor and/or other active device components to enable multifunctional artificial skins.

Further details regarding the subject matter disclosed herein can be found in the publication Toshitake Takahashi, Kuniharu Takei, Andrew G. Gillies, Ronald S. Fearing, and Ali Javey, "Carbon Nanotube Active-Matrix Backplanes for Conformal Electronics and Sensors," Nano Lett. 2011, 11, 5408-5413 (published Nov. 3, 2011), and in the publication Chuan Wang, Jun-Chau Chien, Kuniharu Takei, Toshitake Takahashi, Junghyo Nah, Ali M. Niknejad, and Ali Javey, "Extremely Bendable, High-Performance Integrated Circuits Using Semiconducting Carbon Nanotube Networks for Digital, Analog, and Radio-Frequency Applications," Nano Lett. 2012, 12, 1527-1533 (published Feb. 7, 2012), both of which are herein incorporated by reference.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A device comprising:
   a polymer substrate, the polymer substrate defining a mesh structure;
   a gate electrode disposed on the polymer substrate;
   a dielectric layer disposed on the gate electrode and on exposed portions of the polymer substrate;
   a carbon nanotube network disposed on the dielectric layer; and
   a source electrode and a drain electrode disposed on the carbon nanotube network.

2. The device of claim 1, further comprising:
   a polymer layer disposed on the source electrode, the drain electrode, and exposed portions of the carbon nanotube network.

3. The device of claim 2, wherein the polymer layer comprises poly(p-xylylene).

4. The device of claim 2, wherein the polymer layer is about 250 nanometers to 1 micron thick.

5. The device of claim 1, wherein an area defined by the device is about 2.5 microns to 7.5 microns by about 100 microns to 300 microns.

6. The device of claim 1, wherein the gate electrode includes nickel, and wherein the source electrode and the drain electrode include palladium.

7. The device of claim 1, wherein the carbon nanotube network is about 2 nanometers to 20 nanometers thick.

8. The device of claim 7, wherein the carbon nanotube network has a density of about 10 to 100 nanotubes per micron area of the carbon nanotube network.

9. The device of claim 1, wherein the device is mechanically flexible.

10. The device of claim 1, wherein the dielectric layer is about 20 nanometers to 70 nanometers thick.

11. The device of claim 1, wherein nanotubes of the carbon nanotube network have a length of about 0.4 microns to 0.12 microns.

12. The device of claim 1, wherein nanotubes of the carbon nanotube network have a length of about 0.8 microns.

13. The device of claim 1, wherein the dielectric layer comprises a first silicon oxide layer disposed on the gate electrode, an alumina layer disposed on the first silicon oxide layer, and a second silicon oxide layer disposed on the alumina layer.

14. The device of claim 1, wherein the mesh structure includes a honeycomb mesh structure defining substantially hexagonal holes in the polymer substrate.

15. The device of claim 14, wherein the device is located at an intersection of three lines of the honeycomb mesh structure.

16. The device of claim 14, wherein each of the substantially hexagonal holes in the polymer substrate has sides having a length of about 0.5 millimeters to 2 millimeters.

17. The device of claim 1, wherein a thickness of the polymer substrate is about 10 microns to 40 microns.

18. The device of claim 1, wherein the polymer substrate comprises polyimide.

19. The device of claim 1, wherein the source electrode and the drain electrode each include a layer of titanium disposed on the carbon nanotube network and a layer of palladium disposed on the layer of titanium.

20. A device comprising:
   a polymer substrate, the polymer substrate defining a mesh structure;
   a gate electrode disposed on the polymer substrate;
   a dielectric layer disposed on the gate electrode and on exposed portions of the polymer substrate, the dielectric layer comprising a first silicon oxide layer disposed on the gate electrode, an alumina layer disposed on the first silicon oxide layer, and a second silicon oxide layer disposed on the alumina layer;
   a carbon nanotube network disposed on the dielectric layer; and
   a source electrode and a drain electrode disposed on the carbon nanotube network.

* * * * *